(12) United States Patent
Moschiano et al.

(10) Patent No.: US 8,264,882 B2
(45) Date of Patent: *Sep. 11, 2012

(54) CHARGE LOSS COMPENSATION DURING PROGRAMMING OF A MEMORY DEVICE

(75) Inventors: Violante Moschiano, Bacoli (IT);
Daniel Elmhurst, Folsom, CA (US);
Giovanni Santin, Vazia (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/313,379

(22) Filed: Dec. 7, 2011

(65) Prior Publication Data

US 2012/0075932 A1 Mar. 29, 2012

Related U.S. Application Data

(63) Continuation of application No. 12/123,765, filed on May 20, 2008, now Pat. No. 8,085,591.

(51) Int. Cl.
*G11C 16/34* (2006.01)
*G11C 16/28* (2006.01)
*G11C 16/26* (2006.01)
*G11C 16/06* (2006.01)

(52) U.S. Cl. ........ 365/185.09; 365/185.02; 365/185.03; 365/185.17; 365/185.22; 365/185.2; 365/185.24

(58) Field of Classification Search ............. 365/185.03, 365/185.17, 185.2, 185.22, 185.24, 185.02, 365/185.09
See application file for complete search history.

(56) References Cited

U.S. PATENT DOCUMENTS

| | | | |
|---|---|---|---|
| 5,867,429 A | 2/1999 | Chen et al. | |
| 6,621,741 B2 | 9/2003 | Yano | |
| 6,751,766 B2 | 6/2004 | Guterman et al. | |
| 6,847,553 B2 | 1/2005 | Chen et al. | |
| 8,085,591 B2 * | 12/2011 | Moschiano et al. | ..... 365/185.09 |
| 2006/0028875 A1 | 2/2006 | Avraham et al. | |
| 2006/0098481 A1 | 5/2006 | Okhonin et al. | |
| 2006/0268620 A1 | 11/2006 | Park et al. | |
| 2008/0144388 A1 | 6/2008 | Yamashita | |
| 2008/0175054 A1 | 7/2008 | Hancock et al. | |

* cited by examiner

*Primary Examiner* — J. H. Hur
(74) *Attorney, Agent, or Firm* — Leffert Jay & Polglaze, P.A.

(57) ABSTRACT

In programming a selected word line of memory cells, a first program verify or read operation is performed, after one page of a selected word line is programmed, in order to determine a first quantity of memory cells that have been programmed to a predetermined reference point in the programmed first page distribution. Prior to programming the second page of the selected word line, a second program verify or read operation is performed to determine a second quantity of cells that are still at the reference point. The difference between the first and second quantities is an indication of the quantity of cells that experienced quick charge loss. The difference is used to determine an adjustment voltage for the second page verification operation after programming of the second page.

20 Claims, 7 Drawing Sheets

CHARGE LOSS COMPENSATION DURING PROGRAMMING OF A MEMORY DEVICE

RELATED APPLICATIONS

This is a continuation of U.S. patent application Ser. No. 12/123,765, filed May 20, 2008 (allowed), titled "CHARGE LOSS COMPENSATION DURING PROGRAMMING OF A MEMORY DEVICE" which is commonly assigned, the entire contents of which are incorporated herein by reference.

TECHNICAL FIELD

The present invention relates generally to memory devices and in a particular embodiment the present invention relates to non-volatile memory devices.

BACKGROUND

Memory devices can include internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

During a typical prior art programming operation of a flash memory cell, a selected word line coupled to the selected memory cell to be programmed is biased with a series of incrementing voltage programming pulses that start at an initial voltage that is greater than a predetermined programming voltage (e.g., approximately 16V). The programming pulse increases a charge level, thereby increasing the cell's threshold voltage $V_t$, on a floating gate of the memory cell. After each programming pulse, a verification operation with a word line voltage of 0V is performed to determine if the cell's threshold voltage has increased to the desired programmed level.

Immediately after programming, the floating gate can experience multiple forms of charge loss that occur at the time of ion implantation that can cause defects in the data retention characteristics of the floating gate. These include single bit charge loss, intrinsic charge loss, and quick charge loss.

Single bit charge loss is the result of a defective memory cell that exhibits electron leakage. This leakage can be accelerated with voltage or high temperature stress and results in inferior data retention.

Intrinsic charge loss is an immediate leakage of electrons from the floating gate, closest to the tunnel oxide, after a programming pulse. The trapped charge initially causes the cell $V_t$ to appear higher than the floating gate is programmed. The leakage of these electrons after programming then causes a one time shift in the threshold voltage.

Quick charge loss also causes an immediate $V_t$ shift after a programming pulse. Quick charge loss is the result of electrons trapped in the tunnel oxide layer after the programming pulse moving back into the channel region. When a cell passes the verify operation, the cell is inhibited from further programming and quick charge loss begins. When the cell is read after the program operation has been completed, the cell has a $V_t$ that is lower than the $V_t$ obtained during the program verify operation. This can require an enlargement of the $V_t$ distribution in order to accommodate all possible threshold voltages for a given state.

FIG. 1 shows a plot of $V_{WL}$ versus time of a typical prior art programming operation with the accompanying real and ideal minimum/maximum threshold voltage of the target cell. The upper plot 100 shows the series of incrementally increasing programming pulses 101 being applied to the target cell as the word line voltage $V_{WL}$. After each programming pulse 101, a verify pulse 102 occurs at a $V_{vfy}$ level.

The lower plot 110 shows the resulting $V_t$ of the target cell being programmed. The top $V_t$ plot 112, 116 is the maximum threshold voltage of the target cell and the lower $V_t$ plot 111, 114 is the minimum threshold voltage of the target cell as illustrated in FIG. 2. As the programming pulses 101 of the first plot 100 are applied to the target cell control gate, the $V_t$ 111, 112 increases to approximately the $V_{t\_vfy}$ level. Once at this level, the target cell is verified and inhibited from further programming. The ideal $V_t$ 113, 115 is shown staying level at $V_t$. However, the real $V_t$ 114, 116 of the target cell begins to decrease almost immediately after the last programming pulse.

FIG. 2 illustrates a typical prior art $V_t$ distribution of programmed cells in accordance with the $V_t$ plot of FIG. 1. In FIG. 2, the dotted line 200 represents the ideal distribution while the solid line 201 represents the real distribution. The lower end 205 of the ideal distribution 200 corresponds to the lower ideal $V_t$ plot 113 of FIG. 1 and the upper end 210 of the ideal distribution 200 corresponds to the upper ideal $V_t$ 115. Similarly, the lower end 206 of the real distribution 201 corresponds to the lower real $V_t$ plot 114 and the upper end 207 of the real distribution 201 corresponds to the upper real $V_t$ plot 116.

The lower end of the ideal distribution 200 is verified at the $V_{pgm\_vfy}$ voltage. After the programming operation and subsequent inhibition of the target cell, the distribution shifts in the negative direction by an amount equal to $V_{QCL}$ and ends at the lower $V_t$ 206. Such a shift in the distribution would necessitate an enlarged distribution that starts at the real lower $V_t$ 206 and extends to the ideal upper $V_t$ 210.

In a single level cell (SLC), a $V_t$ distribution enlargement does not have much affect on the reading of a programmed memory cell. However, in a multiple level cell (MLC) memory cell, the state distributions are typically more closely spaced in order to fit all of the states within a low supply voltage range. Enlarging the $V_t$ distributions in an MLC device can thus reduce the number of states that are programmable into the device. Additionally, the enlarged $V_t$ distributions can overlap and result in errors in reading the different states.

For the reasons stated above, and for other reasons stated below that will become apparent to those skilled in the art upon reading and understanding the present specification, there is a need in the art to reduce charge loss in a memory device.

DETAILED DESCRIPTION

Figure 1:
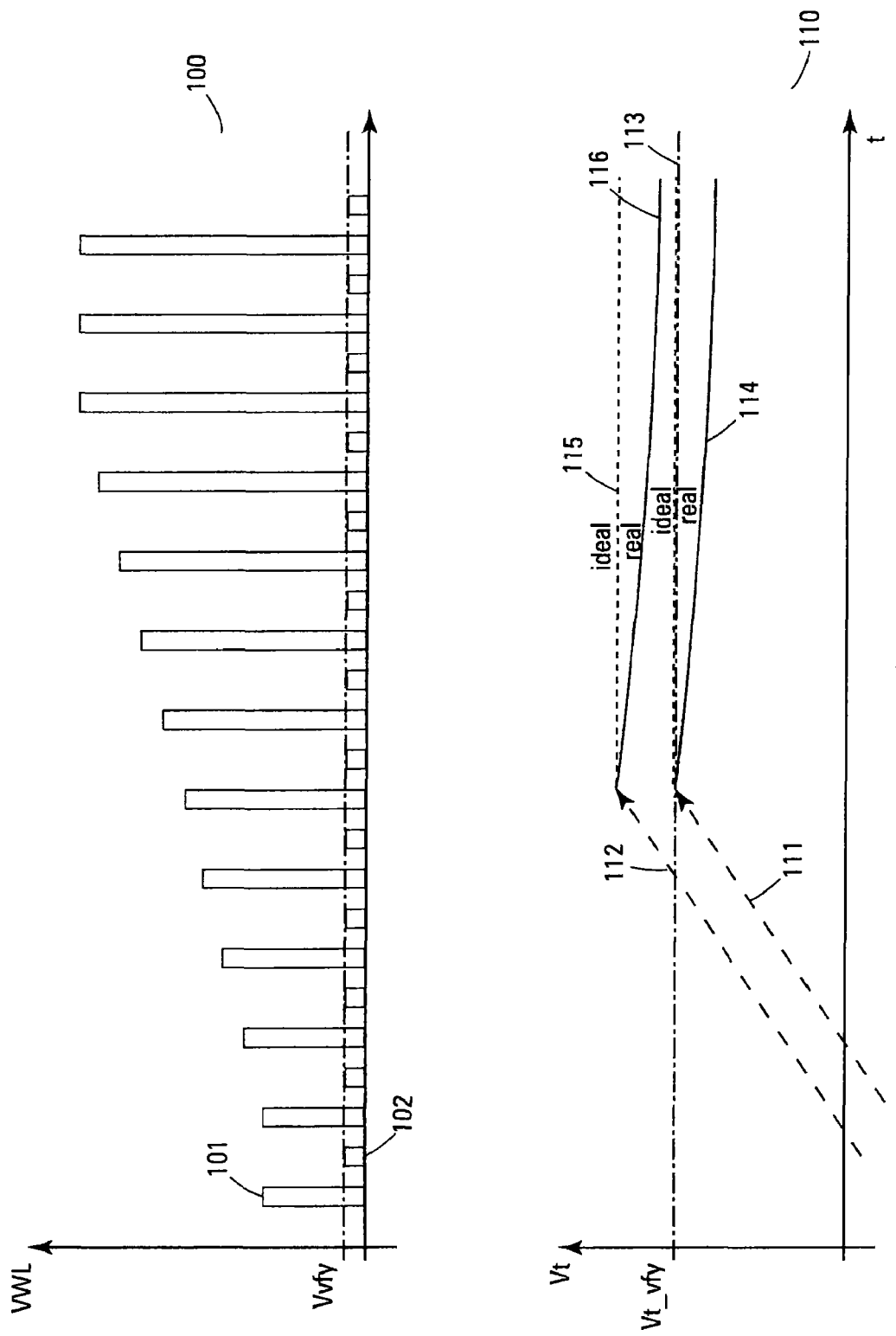
FIG. 1 shows a plot of $V_{WL}$ versus time of a typical prior art programming operation with the accompanying real and ideal $V_t$ of the target cell.
Figure 2:
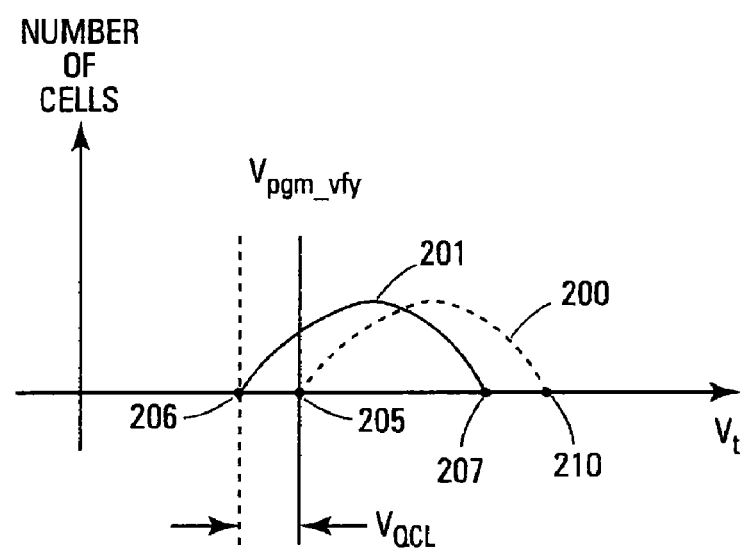
FIG. 2 shows a typical prior art $V_t$ distribution, in accordance with FIG. 1, that has been affected by quick charge loss.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 3:
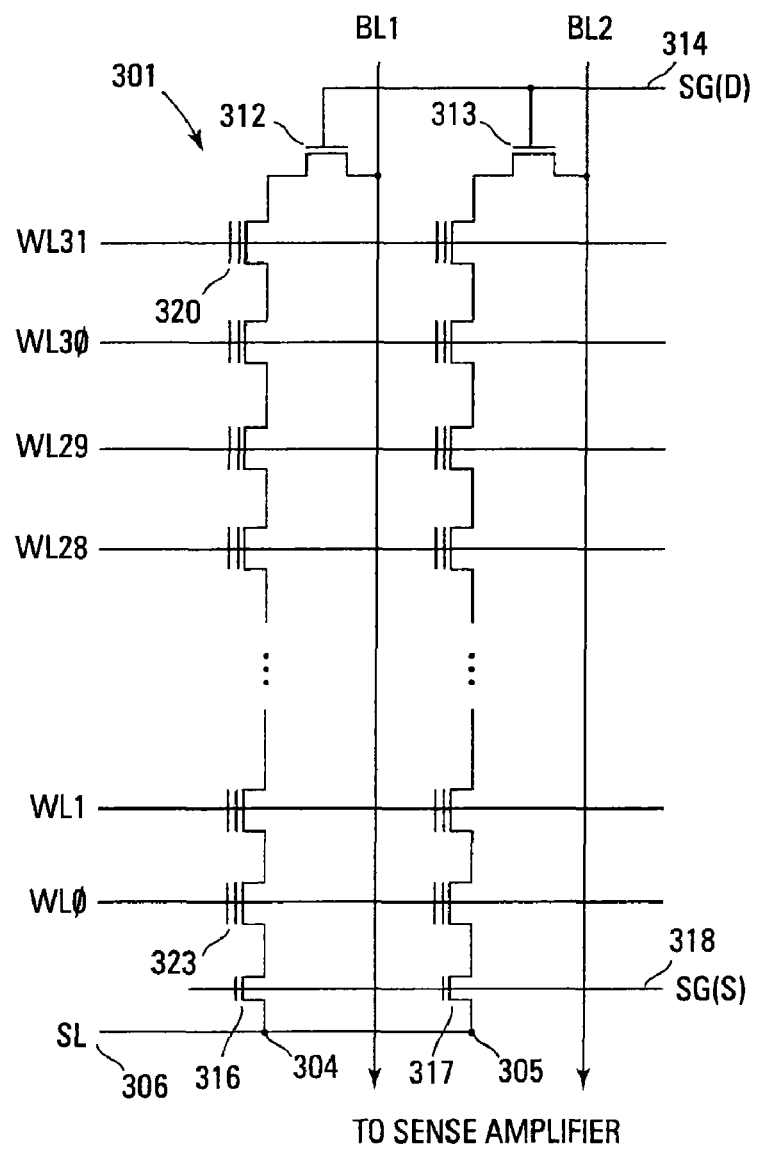
FIG. 3 shows schematic diagram of one embodiment of a portion of a memory array.

FIG. 3 illustrates a schematic diagram of a portion of a NAND architecture memory array 301 comprising series strings of non-volatile memory cells on which one embodiment of the method for charge loss compensation can operate. While the subsequent discussions refer to a NAND memory device, the present embodiments are not limited to such an architecture but can be used in other memory device architectures as well.

The array is comprised of an array of non-volatile memory cells 301 (e.g., floating gate) arranged in columns such as series strings 304, 305. Each of the cells 301 are coupled drain to source in each series string 304, 305. An access line (e.g. word line) WL0-WL31 that spans across multiple series strings 304, 305 is connected to the control gates of each memory cell in a row in order to bias the control gates of the memory cells in the row. Data lines, such as bit lines BL1, BL2 are eventually connected to sense amplifiers (not shown) that detect the state of each cell by sensing current on a particular bit line.

Each series string 304, 305 of memory cells is coupled to a source line 306 by a source select gate 316, 317 and to an individual bit line BL1, BL2 by a drain select gate 312, 313. The source select gates 316, 317 are controlled by a source select gate control line SG(S) 318 coupled to their control gates. The drain select gates 312, 313 are controlled by a drain select gate control line SG(D) 314.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ ranges (that are sometime referred to as windows) that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

In an MLC device, each word line of memory cells typically stores two pages of data, an upper page of data and a lower page of data. This concept is illustrated in the $V_t$ distribution of FIG. 4. This figure illustrates $V_t$ versus the number of cells in each programmed or erased state.

Figure 4:
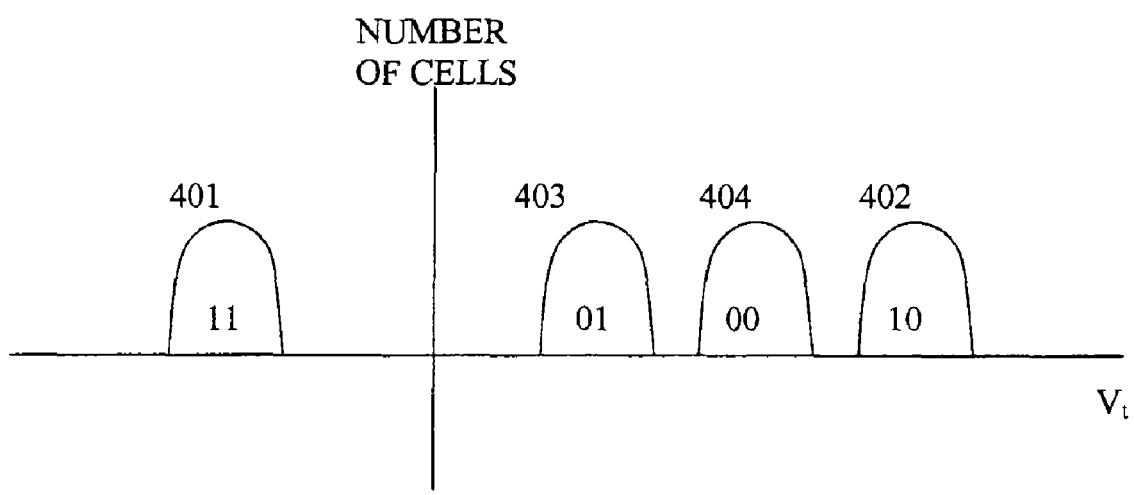
FIG. 4 shows one embodiment of a $V_t$ distribution of a memory cell in accordance with the memory array of FIG. 3.

This diagram shows that the logical 11 state 401 is the most negative state and is typically referred to as the erased state. The logical 10 state 402 is the most positive state. The logical 01 state 403 and the logical 00 state 404 are located between the most negative and most positive states 401, 402. Each logical state of FIG. 4 is comprised of data for both an upper page and a lower page. For example, in the 01 logical state 403, the logical 1 could be the data for the upper page and the logical 0 could be the data for the lower page. Alternate embodiments could reverse these labels. The pages of data can also be referred to as odd and even pages of data.

During a programming operation, a threshold voltage of a target memory cell is moved from one state 401-404 to another. For example, a flash memory cell typically starts in the erased state 401. The cell's threshold voltage is increased by the application to the cell control gate of a series of incrementally increasing programming pulses that start at an initial, high voltage (e.g., approximately 16V) and increase by a step voltage (e.g., 1.0V) until the cell is programmed or an error condition occurs.

If the lower page of a memory cell were to be programmed first to a logical 0, the cell's threshold voltage would be moved from the erased state 401 to the first positive state 403 which is the logical 01 state. The upper page of that same memory cell can then be programmed with a logical 0 by the application of programming pulses to move the cell threshold voltage from the logical 01 state 403 to the logical 00 state 404.

Similarly, if the memory cell has a logical 1 initially programmed in the lower page, the memory cell's threshold voltage would remain in the erased state 401. If the upper page of the cell is programmed with a logical 0, the programming pulses would move the cell's threshold voltage from the erased state 401 to the most positive threshold voltage distribution 402 also referred to as the logical 10 state.

Figure 5:
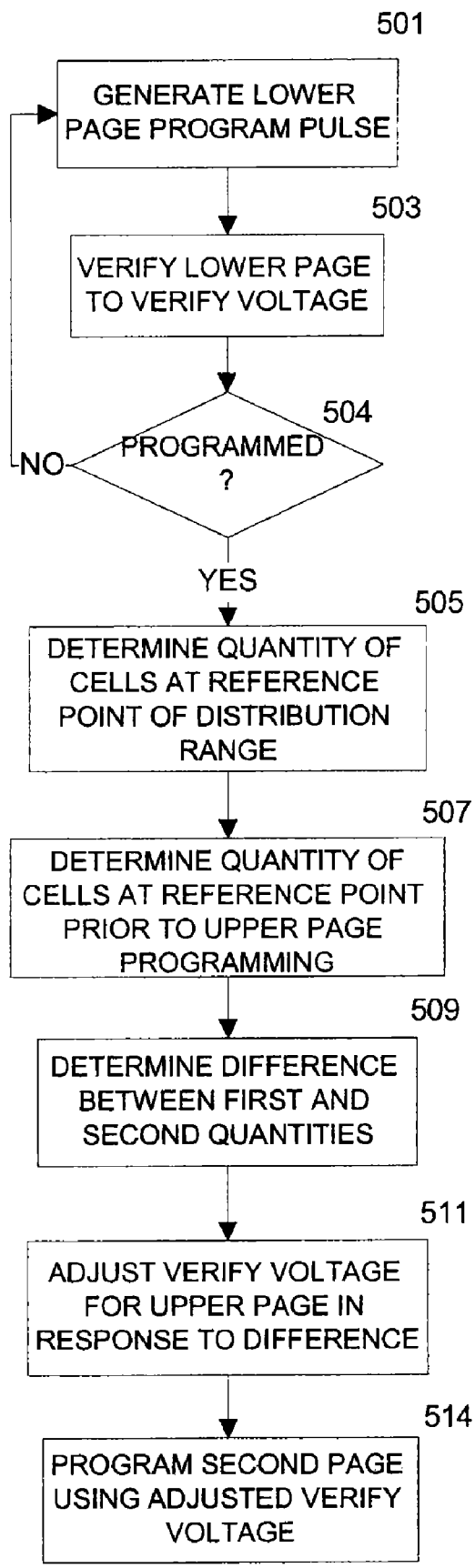
FIG. 5 shows a flowchart of one embodiment of a method for quick charge loss compensation in a memory array.

FIG. 5 illustrates a flowchart of one embodiment of a method for quick charge loss compensation in a memory device, such as the one illustrated subsequently in FIG. 6 that includes the memory array of FIG. 3. The subsequent discussion assumes that the lower page of data is programmed prior to the upper page. However, an alternate embodiment can reverse this programming order and still use the method illustrated in FIG. 5.

The lower page of a word line of memory cells is initially programmed by the issuance of a programming pulse 501. A program verify is then performed on the lower page 503 to determine if the cells have been successfully programmed to the target threshold voltages. If any cells of the word line have not been successfully programmed 504, the programming pulse is incremented by the step voltage and the programming 501 and verify 503 steps repeated until the program verify passes.

The program verify operation, in one embodiment, is a read of a cell to determine its stored voltage level and a comparison of that voltage level with a target voltage level. In a typical program verify operation, the bit line is precharged to a voltage in the range of 0.2-1.2V. The word line of the target cell (referred to herein as the selected word line) is biased with a read voltage of approximately 0-5V and unselected word lines are biased at a voltage greater than 6V. This couples the selected cells to sense circuitry, such as sense amplifiers, for reading/verifying the programmed status of the cells. As a result of the program verify operation, the memory cells at or above the target verify level are considered to be programmed while the memory cells below the target verify level are not programmed.

At the completion of the successful program verify 503, the quantity of memory cells that are at a reference point of the lower page distribution is then determined 505. The quantity of memory cells at the reference point can be determined by a program verify or a memory read operation. These operations can generate a count of the number of memory cells at a particular threshold voltage reference point. In the illustrated embodiment of FIG. 6, the reference point is approximately at the fifty percent point 601 of the programmed lower page distribution 602.

The fifty percent point 601 of this distribution 602 is the threshold voltage at which fifty percent of the memory cells programmed to a particular state can be verified to the program verify voltage $PV_{CL}$ as illustrated. This point 601 can be determined by the quantity of memory cells that verify at the word line voltage of half the sum of the program verify voltage plus the program step voltage. This equation can be illustrated as $V_{WL}=(PV+STEP)/2$ where PV is the initial program verify voltage to which the memory cell verifies and STEP is the programming pulse step voltage.

Figure 6:
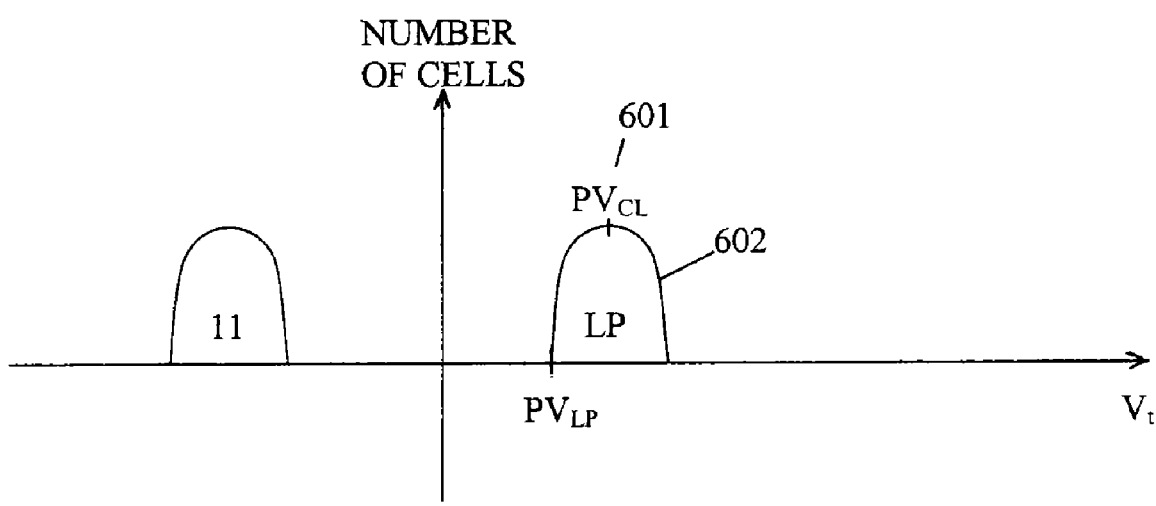
FIG. 6 shows one embodiment of a partial multilevel cell threshold voltage distribution in accordance with the embodiment of FIG. 5.

FIG. 6 also shows the minimum lower page program verify voltage ($PV_{LP}$) for the distribution 602. This is the lowest voltage to which the memory cell verifies in order to be included within the lower page programmed distribution 602.

Referring again to the method of FIG. 5, after the quantity of cells verified at the reference point are determined 505 subsequent to lower page programming, the upper page is programmed. Immediately prior to the upper page programming, the number of memory cells verified at the reference point is again counted to determine a new quantity of cells at this point 507. This memory cell count is accomplished with either a program verify operation or a memory read operation. Due to quick charge loss, the quantity of cells counted immediately prior to the upper page programming will likely be less than the number of cells verified at the reference point immediately after the lower page programming. The difference between these two quantities is determined 509 and the verify voltage for the upper page programming is adjusted in response to this difference 511. The adjusted verify voltage is then used during the programming of the upper page of data 514.

In one embodiment, a table is stored in memory that includes the percentage differences between the two cell count quantities along with the associated voltage offset in the verify word line voltage. For example, one element of the table could include a ten percent decrease from the initial quantity of cells counted after the lower page programming to the quantity of cells counted prior to the upper page programming. Associated with this ten percent decrease is a word line verify voltage change of 100 mV. This word line voltage change is then added to the target verify voltage used in the subsequent programming of the upper page of memory cells on that word line.

As an example of operation of the embodiment illustrated in FIG. 5, after the programming of the lower page of data on a selected word line, the quantity of memory cells found to be at the fifty percent reference point of the lower page programmed distribution is found to be 5000. Prior to programming the upper page of the memory cells, the quantity of cells on the selected word line that are found to be at the fifty percent reference level has decreased to 4500. This is a ten percent decrease in the quantity of memory cells at the reference point. The table in memory is then accessed to determine that the associated program verify adjustment voltage for a ten percent decrease is 100 mV. The 100 mV adjustment is added to the target threshold voltage for the upper page program verification.

The quantity of memory cells that experience the quick charge loss typically increases as the memory device experiences a greater number of erase/program cycles. For example, a memory device that has only experienced one or two erase/program cycles might not have any difference between the quantity of memory cells counted immediately after the lower page programming and the quantity of cells counted immediately prior to the upper page programming. However, after the memory device experiences a larger number of erase/program cycles (e.g., 1 k cycles), the percentage difference between the two counted quantities will probably have increased.

The table in memory that stores the change in reference point memory cell quantity with the associated verify voltage adjustment can be generated during the manufacturing and testing process for the memory device. The different memory cell count changes with their associated voltage adjustments can be based on the memory technology and empirical testing of the various memory technologies to determine the best voltage adjustment for each percent change in the memory cell count change. In one embodiment, a different voltage adjustment is associated with every percent change. Other embodiments can base a different voltage adjustment on every five or ten percent change.

Figure 7:
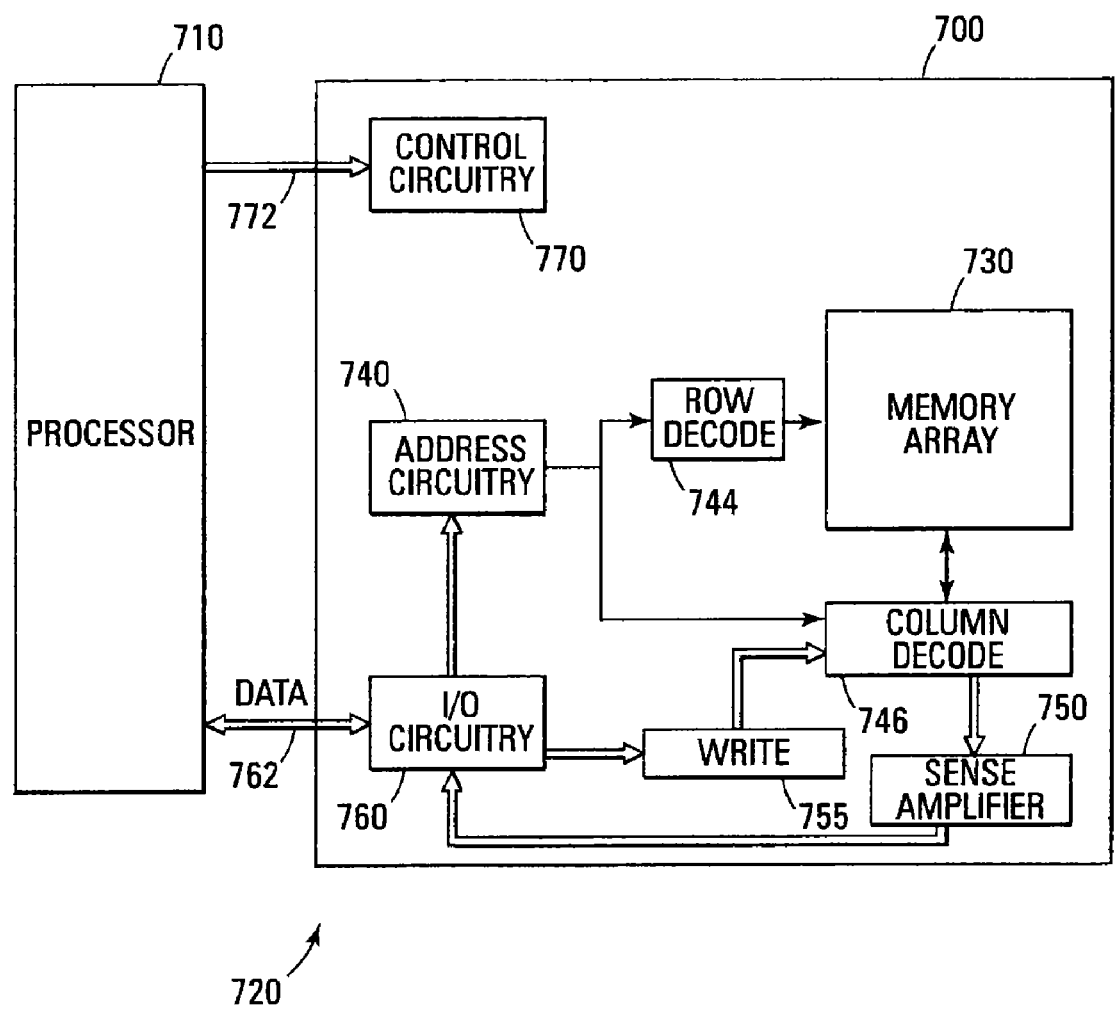
FIG. 7 shows block diagram of one embodiment of a memory system that incorporates the method for quick charge loss compensation.

FIG. 7 illustrates a functional block diagram of a memory device 700. The memory device 700 is coupled to an external processor 710. The processor 710 may be a microprocessor or some other type of controlling circuitry. The memory device 700 and the processor 710 form part of a memory system 720. The memory device 700 has been simplified to focus on features of the memory that are helpful in understanding the present invention.

The memory device 700 includes an array 730 of non-volatile memory cells, such as the one illustrated previously in FIG. 3. The memory array 730 is arranged in banks of word line rows and bit line columns. In one embodiment, the columns of the memory array 730 are comprised of series strings of memory cells. As is well known in the art, the connections of the cells to the bit lines determines whether the array is a NAND architecture, an AND architecture, or a NOR architecture.

Address buffer circuitry 740 is provided to latch address signals provided through the I/O circuitry 760. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

The memory device 700 reads data in the memory array 730 by sensing voltage or current changes in the memory array columns using sense amplifier circuitry 750. The sense amplifier circuitry 750, in one embodiment, is coupled to read and latch a row of data from the memory array 730. Data input and output buffer circuitry 760 is included for bidirectional data communication as well as address communication over a plurality of data connections 762 with the controller 710. Write circuitry 755 is provided to write data to the memory array.

Memory control circuitry 770 decodes signals provided on control connections 772 from the processor 710. These signals are used to control the operations on the memory array 730, including data read, data write (program), and erase operations. The memory controller circuitry 770 may be a state machine, a sequencer, or some other type of controller to generate the memory control signals. In one embodiment, the memory control circuitry 770 is configured to execute the programming method of the present embodiments in order to compensate for quick charge loss in the memory device.

The flash memory device illustrated in FIG. 7 has been simplified to facilitate a basic understanding of the features of the memory. A more detailed understanding of internal circuitry and functions of flash memories are known to those skilled in the art.

CONCLUSION

In summary, one or more embodiments provide compensation for quick charge loss in a memory device during a programming operation. In one such embodiment, a first program verify operation is performed, after one page of a selected word line is programmed, to determine a first quantity of memory cells that have been programmed to at least a reference point in the programmed first page distribution. Prior to programming the second page of the selected word line, a second verify operation is performed to determine a second quantity of cells that are still at the reference point. The difference between the first and second quantities is used to determine an adjustment voltage for the second page verification operation. In another embodiment, the second quantity of cells is at or above the reference point.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for quick charge loss compensation in a memory device, the method comprising:
increasing a respective threshold voltage of each of a plurality of memory cells;
counting, at a first time after increasing their respective threshold voltages, a first quantity of memory cells of the plurality of memory cells that have been verified to a reference threshold voltage;
counting, at a second time subsequent to the first time, a second quantity of memory cells that have been verified at least to the reference voltage; and
adjusting a program verify voltage used in subsequent programming of the plurality of memory cells in response to a difference between the first quantity of memory cells and the second quantity of memory cells.

2. The method of claim 1 wherein increasing the respective threshold voltage of each of the plurality of memory cells comprises increasing the threshold voltages to a lower page threshold voltage distribution.

3. The method of claim 2 wherein the reference threshold voltage is at a fifty percent point of the lower page threshold voltage distribution.

4. The method of claim 1 wherein increasing the respective threshold voltage of each of the plurality of memory cells comprises increasing the threshold voltages to a first state.

5. The method of claim 4 and further comprising increasing the respective threshold voltages of the plurality of memory cells to a second state after counting at the first time and prior to counting for the second time.

6. The method of claim 5 wherein the first state comprises a lower page of data and the second state comprises an upper page of data.

7. The method of claim 1 wherein increasing the respective threshold voltages comprises applying a plurality of incrementally increasing voltage pulses to control gates of the plurality of memory cells.

8. A method for quick charge loss compensation in a memory device, the method comprising:
determining a first quantity of a plurality of memory cells that are programmed to at least a reference threshold voltage that corresponds to a first threshold voltage distribution;
subsequent to determining the first quantity and prior to programming to a second threshold voltage distribution, determining a second quantity of the plurality of memory cells that are still programmed to at least the reference threshold voltage;
generating a verify voltage in response to a difference between the first quantity and the second quantity of memory cells;
programming the plurality of memory cells to the second threshold voltage distribution; and
program verifying the plurality of memory cells with the generated verify voltage.

9. The method of claim 8 wherein generating the verify voltage comprises accessing a table in memory.

10. The method of claim 9 wherein accessing the table in memory comprises accessing an offset voltage from the table responsive to the difference between the first and second quantities of memory cells.

11. The method of claim 10 wherein the generated verify voltage is equal to a sum of the offset voltage and an initial verify voltage.

12. The method of claim 11 wherein the initial verify voltage comprises a target verify voltage associated with the second threshold voltage distribution.

13. A memory device comprising:
an array of memory cells; and
control circuitry configured to control operation of the memory device, the control circuit configured to count, at a first time, a first quantity of memory cells, of a plurality of memory cells, that have been verified to a reference threshold voltage, count, at a second time after the first time, a second quantity of memory cells that are still verified to the reference threshold voltage, and program the plurality of memory cells to a state that is verified with a verify voltage generated responsive to a difference between the first quantity and the second quantity.

14. The memory device of claim 13 wherein the control circuitry is further configured to access a table to generate the verify voltage.

15. The memory device of claim 14 wherein the table comprises at least one difference between the first quantity and the second quantity with an associated offset voltage.

16. A system comprising:
a controller configured to control operation of the system; and
a memory device coupled to the controller and configured to operate in response to the controller, the memory device comprising:

a memory array comprising a plurality of memory cells; and control circuitry configured to control operation of the memory array, wherein the control circuitry is configured to: increase threshold voltages for a set of memory cells at a first time, count a first quantity of memory cells having a threshold voltage at least at a reference threshold voltage, count a second quantity of the memory cells having threshold voltages still at least at the reference voltage a time period later, and adjust a subsequent program verify voltage by an amount in response to a difference between the first quantity and the second quantity.

17. The system of claim 16 wherein the memory array is configured as a plurality of series strings of memory cells.

18. The system of claim 16 wherein, at the first time, the control circuitry increases the threshold voltages to a first state.

19. The system of claim 16 wherein the control circuitry is further configured to perform a memory read operation of the set of memory cells after the first time.

20. The system of claim 16 wherein the reference voltage is a fifty percent point of a lower page programmed distribution.

* * * * *